United States Patent
Wang

(10) Patent No.: US 7,450,432 B2
(45) Date of Patent: Nov. 11, 2008

(54) METHOD OF PROGRAMMING DATA IN A FLASH MEMORY DEVICE

(75) Inventor: Jong Hyun Wang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/771,792

(22) Filed: Jun. 29, 2007

(65) Prior Publication Data

US 2008/0175064 A1    Jul. 24, 2008

(30) Foreign Application Priority Data

Jan. 23, 2007    (KR) ...................... 10-2007-0007039

(51) Int. Cl.
*G11C 16/06* (2006.01)
*G11C 16/04* (2006.01)

(52) U.S. Cl. .................. 365/185.28; 365/185.03; 365/185.22

(58) Field of Classification Search ............. 365/185.28
See application file for complete search history.

(56) References Cited

U.S. PATENT DOCUMENTS

| | | | |
|---|---|---|---|
| 6,219,276 B1 * | 4/2001 | Parker ................... | 365/185.03 |
| 6,961,266 B2 * | 11/2005 | Chang ................... | 365/185.03 |
| 7,035,146 B2 | 4/2006 | Hemink et al. | |
| 7,057,934 B2 | 6/2006 | Krishnamachari et al. | |
| 7,061,798 B2 | 6/2006 | Chen et al. | |
| 7,116,581 B2 | 10/2006 | Suzuki et al. | |
| 7,193,911 B2 | 3/2007 | Kim | |
| 7,403,422 B2 * | 7/2008 | Kim et al. .............. | 365/185.19 |
| 2005/0185470 A1 * | 8/2005 | Suzuki et al. .......... | 365/185.28 |
| 2007/0058446 A1 * | 3/2007 | Hwang et al. .......... | 365/185.29 |
| 2007/0159892 A1 * | 7/2007 | Kang et al. ............ | 365/185.24 |
| 2007/0183210 A1 * | 8/2007 | Choi et al. ............. | 365/185.22 |

* cited by examiner

*Primary Examiner*—Son L Mai
(74) *Attorney, Agent, or Firm*—Townsend and Townsend and Crew LLP

(57) ABSTRACT

A method of programming a most significant bit (MSB) data to a multi-level cell in a flash memory device including first and second cells includes performing a first program operation on the first cell using a first program voltage, the first cell being in a first state when the first program operation is performed on the first cell; if the first cell is determined to be in a second state after the first program operation, defining a second program voltage based on a result of comparing the first program voltage with a start voltage predefined for a second program operation; and performing the second program operation on the second cell using the second program voltage that has been defined according to a result of the comparison between the first program voltage and the start voltage.

16 Claims, 4 Drawing Sheets

METHOD OF PROGRAMMING DATA IN A FLASH MEMORY DEVICE

CROSS-REFERENCE TO RELATED APPLICATIONS

This application claims priority from Korean Patent Application No. 2007-007039, filed on Jan. 23, 2007, the contents of which are incorporated herein by reference in its entirety.

BACKGROUND OF THE INVENTION

The present invention relates to a multi-level cell (MLC) flash memory device. More particularly, the present invention relates to a method of programming data in a flash memory device where setting a program start voltage depends on a shift path of a threshold voltage in order to improve a program time.

Generally, flash memory is categorized into a NAND flash memory or a NOR flash memory. Here, the NOR flash memory has excellent random access time characteristics because memory cells are independently connected to a bit line and a word line. Whereas, in the NAND flash memory, only one contact is required for one cell string because memory cells are serially connected and so the NAND flash memory has excellent characteristics in view of the degree of integration. Accordingly, the NAND flash memory is generally employed in highly integrated flash memory. A configuration of the NAND flash memory is described in more detail in U.S. Pat. No. 7,193,911, which is incorporated by reference.

Recently, a multi-bit cell for storing a plurality of data in one memory cell has been actively studied for the purpose of increasing the degree of integration of the flash memory.

This memory cell is referred to as a multi-level cell (MLC). Whereas, a memory cell for storing one bit is referred to as a single level cell (SLC).

FIG. 1 is a view illustrating a cell voltage distribution of a multi-level cell for storing data of 2 bits. A memory cell for storing data of 2 bits has four cell distributions, i.e. a cell distribution corresponding to data [11], a cell distribution corresponding to data [10], a cell distribution corresponding to data [00] and a cell distribution corresponding to data [01]. When programming the least significant bit (LSB), the threshold voltage may be shifted from state [11] to state [10] as shown by an arrow 1 in FIG. 1. When programming the most significant bit (MSB), the threshold voltage may be shifted from the state [11] to the state [00] or [01], as shown by arrows 2 in FIG. 1.

Arrows 1, 2, and 3 of FIG. 1 illustrate a plurality of program operations performed on a group of MLCs, e.g., a page of MLCs. The page has first, second, and third groups of MLCs, where each group has one or more MLCs. A LSB program is performed on the first group of MLCs to place the first group in the state [10] (see arrow 1). A first MSB program is performed on the second group of MLCs to place the second group in the state [00] (see arrow 2). The second group may be the same or a subset of the first group. A second MSB program is performed on a third group of MLCs to place the third group in the state [01] (see arrow 3).

In the case that the flash memory device programs data to the MLC, the flash memory device may minimize a program time by optimizing a program voltage Vpgm so as to shift a threshold voltage of each of the cells as shown in FIG. 1. A threshold voltage of MLC is increased by performing the LSB program once and performing the MSB program twice, as explained above.

FIG. 2A is a view illustrating a change of a threshold voltage of a cell in the LSB program of FIG. 1. A program voltage Vpgm in the form of a pulse is supplied for performing the LSB program. The threshold voltage of the cell is changed, thereby programming the data therein in accordance with the program voltage Vpgm. The program voltage Vpgm is applied in accordance with an increment step pulse program (ISPP) method where the program voltage Vpgm is increased in an increment of 0.2V from a first voltage (a) which is a start voltage for the LSB program operation.

In addition, the threshold voltage of the cells is augmented along a path P1 by applying the ISPP method. A program verification checks the threshold voltage of the cells to determine if the cells have been programmed properly to a first state associated with a first verifying voltage PV1. If the threshold voltage of the cells is determined to be greater than the first verifying voltage PV1, then the cells are deemed to have been programmed properly to the first state, e.g., [10].

FIG. 2B is a view illustrating a change of a threshold voltage of the cell in the MSB program in connection with FIG. 1. The threshold voltage of the cell may be shifted as shown in FIG. 1 (see arrows 2 and 3) when the first and second MSB program operations are performed. Different program voltages Vpgm are applied for the first and second MSB program operations. The ISPP method is applied using the start voltage that is a second voltage (b) for the first MSB program operation.

Accordingly, the threshold voltage of the cell is increased beyond the second verifying voltage PV2 along a path P2. Additionally, the threshold voltage of the cell is augmented up to the third verifying voltage PV3 along a path P3.

When programming using the P2 path, the voltage increment (e.g., 0.2V) of the ISPP method has to be sufficiently small to reach the second verifying voltage PV2 without over-shooting beyond the third verifying voltage PV3. However, the use of a small voltage increment means that the program time would be longer and more power would be used to reach the third verifying voltage via the P3 path.

SUMMARY OF THE INVENTION

The present invention relates to a method of programming data in the flash memory device for setting a program voltage depending on a distribution of a threshold voltage of a cell when a multi-level cell is programmed, thereby reducing the program time.

In one embodiment, a method of programming data in a flash memory device including a plurality of multi-level cells is provided. The multi-level cells include a first cell and a second cell. The method includes performing a first program operation on the first cell using a first program voltage, the first cell being in a first state when the first program operation is performed on the first cell; determining whether or not the first cell is programmed to a second state after the first program operation has been performed; if the first cell is determined to be in the second state, comparing the first program voltage and a start voltage for a second program operation; defining a second program voltage for the second program operation based on a result of the comparison; performing the second program operation on the second cell using the second program voltage that has been defined according to the result of the comparison; determining whether or not the second cell is programmed to a third state; increasing the second program voltage by a first voltage increment if the second cell is determined not be in the third state after the second program voltage has been applied to the second cell; and programming the second cell again using the increased second program voltage.

In one embodiment, defining the second program voltage involves setting the start voltage as the second program voltage if the first program voltage is determined to be not greater than the start voltage. The first cell has been programmed to put the first cell in the first state prior to the first program operation.

In one embodiment, the method further comprises performing a least significant bit (LSB) program on the first cell to program the first cell to the first state, wherein the LSB program is performed prior to the first program operation. The method further comprising increasing the first program voltage by a second voltage increment if the first cell is determined not to be in the second state; and programming the first cell again using the increased first program voltage, wherein the comparing step involves comparing the increased first program voltage with the start voltage.

In one embodiment, the method relates to programming a most significant bit (MSB) of the first and second cells after programming the LSB data at least to the first cell, wherein a page of multi-level cells is programmed, the page including the first and second cells, and wherein the first cell is programmed only to the second state, and the second cell is programmed from the first state to the third state.

In another embodiment, a method of programming a most significant bit (MSB) data to a multi-level cell in a flash memory device including first and second cells includes performing a first program operation on the first cell using a first program voltage, the first cell being in a first state when the first program operation is performed on the first cell; if the first cell is determined to be in a second state after the first program operation, defining a second program voltage based on a result of comparing the first program voltage with a start voltage predefined for a second program operation; and performing the second program operation on the second cell using the second program voltage that has been defined according to a result of the comparison between the first program voltage and the start voltage.

In another embodiment, the method further comprises determining whether or not the second cell is programmed to a third state after the second program voltage has been applied to the second cell; increasing the second program voltage by a first voltage increment if the second is determined not be in the third state after the second program voltage has been applied to the second cell; and programming the second cell again using the increased second program voltage, wherein the first, second, and third states are associated with first, second, and third verifying voltages, respectively, and wherein the start voltage is at a level between the second and third verifying voltages.

As described above, a method of programming data in a flash memory device of the present invention sets a program start voltage corresponding to each of verifying voltages when a multi level cell is programmed, thereby adjusting a program voltage into a program voltage corresponding to a cell distribution of upper level after a program verification about a cell distribution of lower level is passed. As a result, a program pulse, a program time and a consumption of a power may be reduced.

DESCRIPTION OF SPECIFIC EMBODIMENTS

Hereinafter, the embodiments of the present invention will be explained in more detail with reference to the accompanying drawings.

Figure 3:
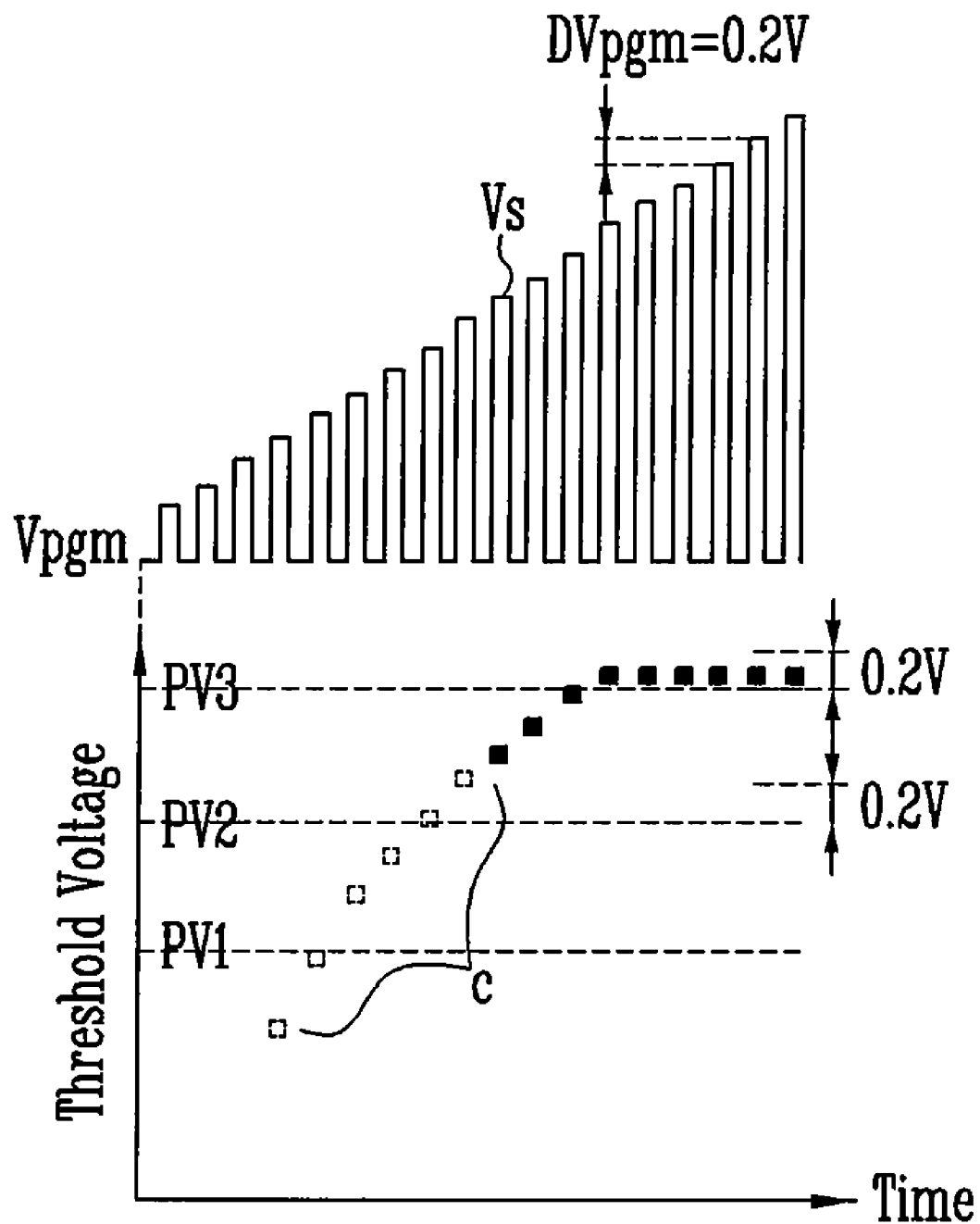
FIG. 3 is a view illustrating a change of a threshold voltage of a cell using a program method according to one embodiment of the present invention.

Referring to FIG. 3, the method of programming a MSB data of the present embodiment sets a start voltage of a program voltage depending on a program distribution of a cell and then applies the program voltage from the start voltage so that the program voltage is not unnecessarily applied and a program time is reduced.

A verifying voltage in the MLC program has a first verifying voltage PV1 that is used to verify whether or not the threshold voltage of a cell is in [10] state (or a first state), i.e., the LSB program is verified. A second verifying voltage PV2 is used to verify whether or not the threshold voltage of the cell is in [00] state (or a second state). A third verifying voltage PV3 is used to verify whether or not the threshold voltage of the cell is in [01] state (or a third state). In the present embodiment, the start voltage of the program varies depending on the target state, i.e., [10], [01], or [00].

In other words, in the case of a multi-level cell MLC for storing data of 2 bits, the LSB program is performed when there is no cell in having the threshold voltage at an area C, as shown in FIG. 3. Then the program verification is performed using the first verifying voltage PV1. If the program verification is passed, the first and second MSB program operations may be performed. In the present embodiment, the first MSB program operation is performed first and then the program verification is performed using the second verifying voltage PV2. If the program verification is passed, then the second MSB program is performed. An initial program voltage to be used for the second MSB program operation is set based on a comparison made between the last program voltage used for the first MSB program operation and a predefined start voltage for the second MSB program, as will be explained later.

In the present embodiment, three start voltages are defined for the three programming operations: the LSB program operation, the first MSB program operation, and the second MSB program operation. A first start voltage Vs1 is a start voltage for the LSB program operation. A second start voltage Vs2 is a program start voltage for the first MSB program and is related to the second verifying voltage PV2. A third start voltage Vs3 is a program start voltage for the second MSB program and is related to the third verifying voltage PV3. Here, the start voltage Vs shown in FIG. 3 is the third start voltage Vs3.

Figure 4:
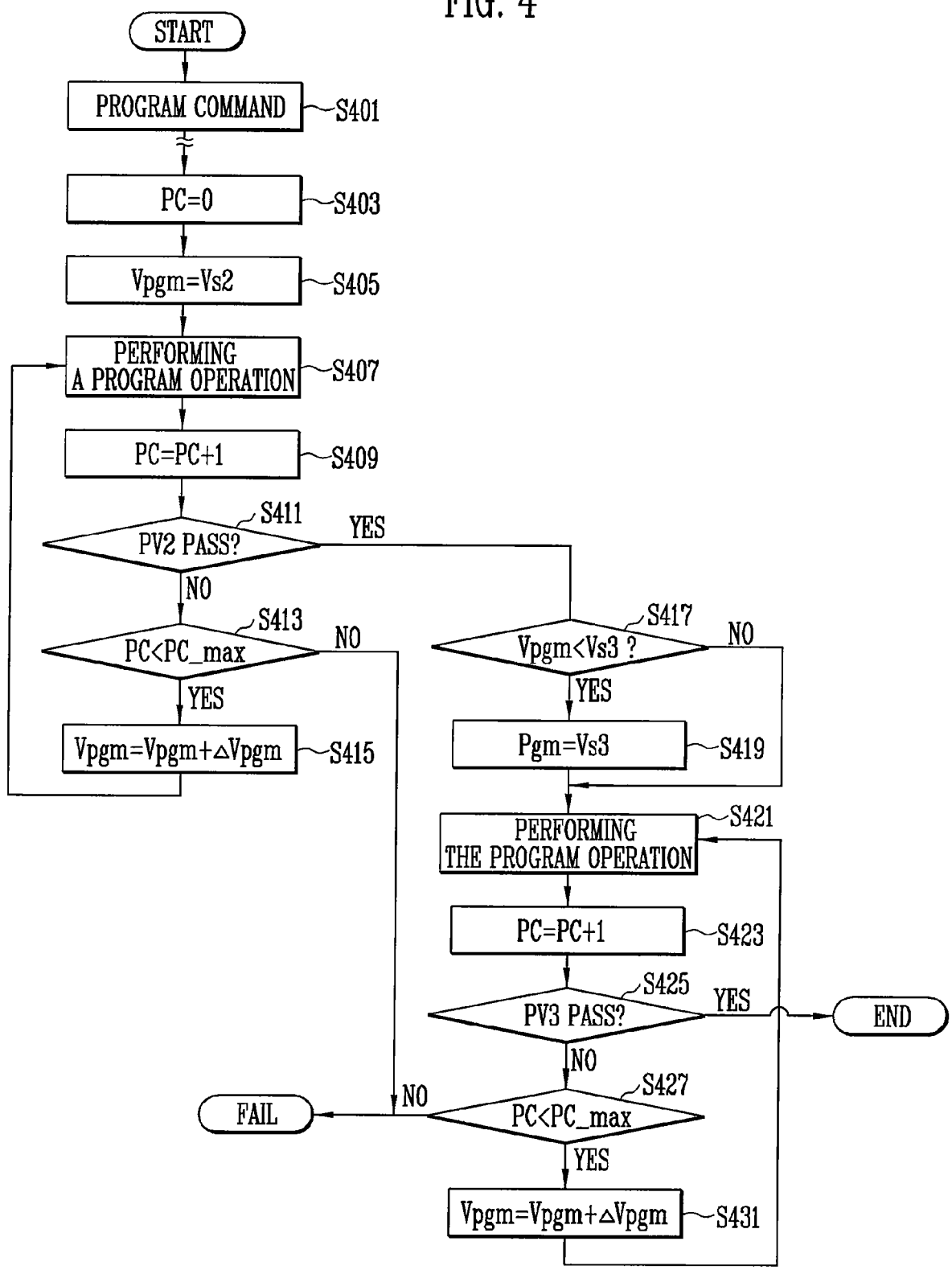
FIG. 4 is a flow chart illustrating a method of programming data in the flash memory device according to one embodiment of the present invention.

FIG. 4 is a flow chart illustrating a method of programming MSB data in the flash memory device according to one embodiment of the present invention. The flash memory device includes a plurality of MLCs that are configured to be programmed to first, second, and third states. The first state is associated with the first verifying voltage PV1. The second state is associated with the second verifying voltage PV2. The third state is associated with the third verifying voltage PV3. The method disclosed in FIG. 4 relates first and second MSB program operations, i.e., to putting the cells in the second or third state. Steps S405 to S415 relate to the first MSB program operation performed on one group of MLCs. Steps S417 to S431 relate to the second MSB program operation performed on another group of MLCs.

Figure 1:
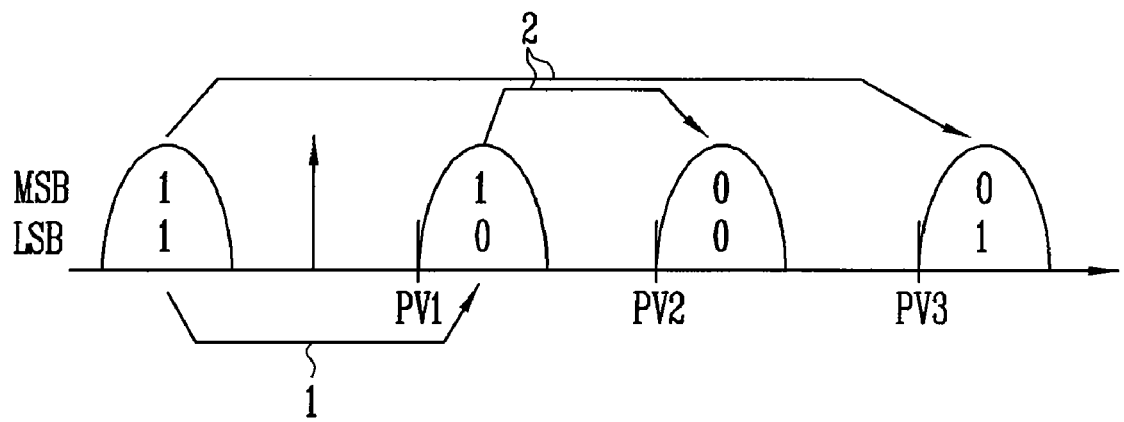
FIG. 1 is a view illustrating a cell voltage distribution of a multi-level cell for storing data of 2 bits.
Figure 2A:
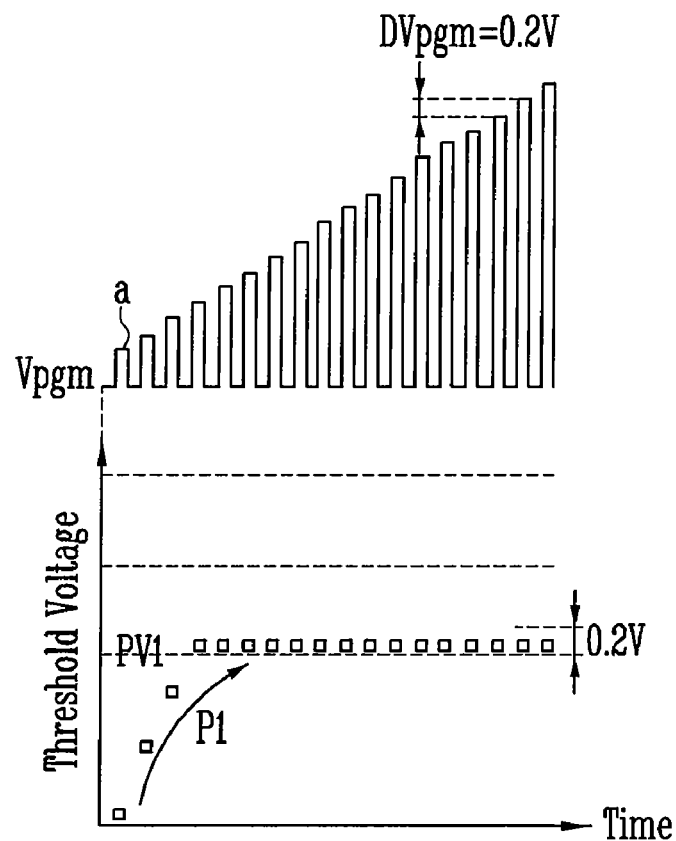
FIG. 2A is a view illustrating a change of a threshold voltage of a cell in the LSB program of FIG. 1.
Figure 2B:
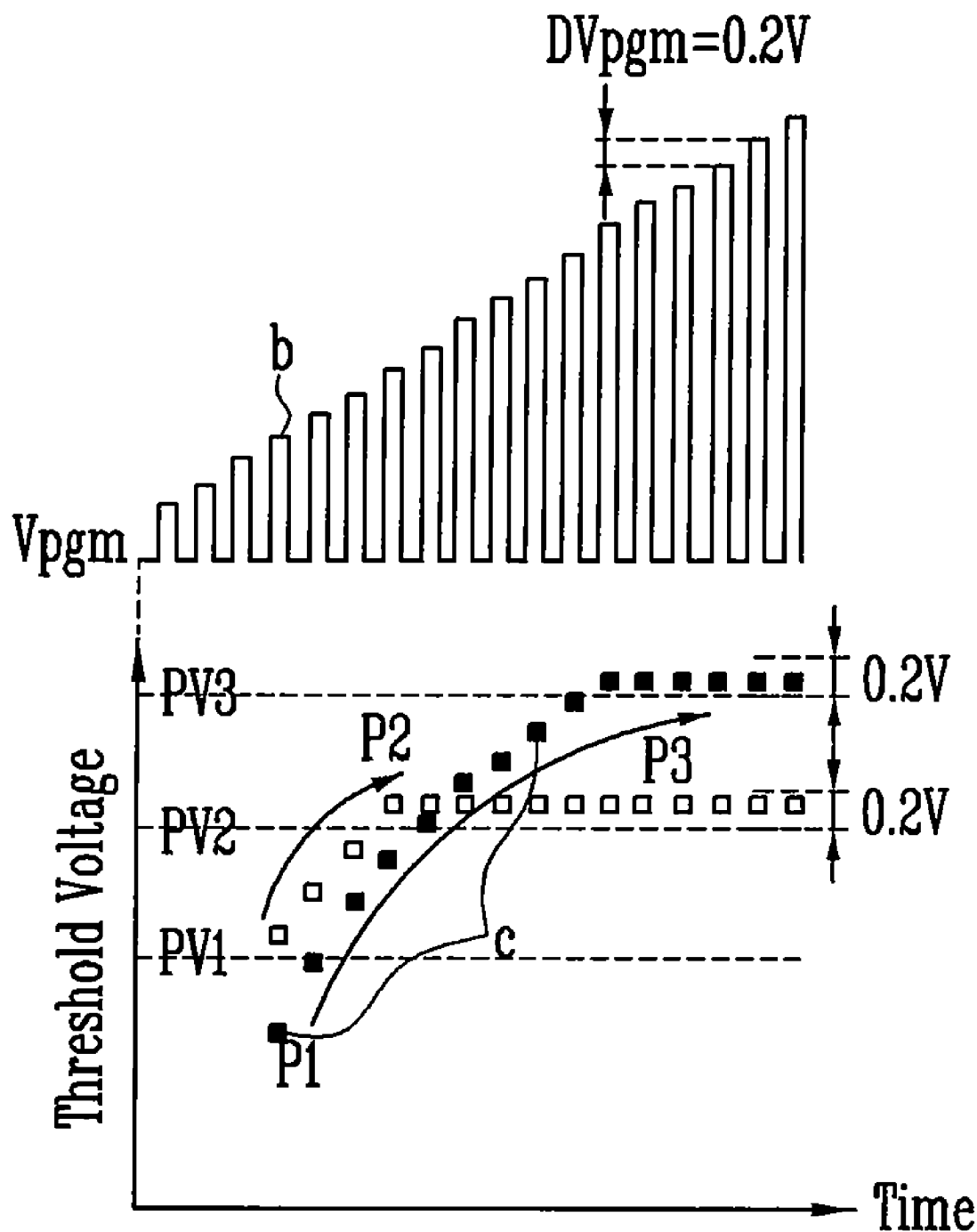
FIG. 2B is a view illustrating a change of a threshold voltage of the cell in the MSB program of FIG. 1.

Generally, the program operations are performed on a group of MLCs, e.g., a page of MLCs. The page has a plurality of MLCs that may be programmed to different states. For example, a first group may be programmed to a first state by an LSB program operation. A second group may be programmed to a second state by a first MSB program operation. A third group may be programmed to a third state by a second MSB program operation (see FIG. 1).

Referring to FIG. 4, in the case that a program command is inputted to the flash memory device of the present embodiment in step of S401, a controller (not shown) included in the flash memory device prepares a program operation by resetting a program counter (PC) to "0" (step S403).

The PC is used to determine whether or not a program failure has occurred. The PC is incremented by "1" each time a program operation is carried out. The program operation is repeated until the program verification is successfully made. If the value of the PC becomes equal to a predefined number, then a program failure is deemed to have occurred since the program verification could not be made within the predefined number of operations. Note although not shown, the controller may first perform a LSB program operation from the first start voltage Vs1 to place a first group of cells in the first state associated with the first verifying voltage PV1.

After the LSB program, the controller starts the first MSB program operation from the second start voltage Vs2 to place a second group of cells in the second state associated with the second verifying voltage PV1 (step S405). The second group may be the same or subset of the first group of cells.

The first MSB program operation is performed on the second group of cells in accordance with the program start voltage defined at step S405 (step S407). The PC is increased by 1 as the MSB program is being performed (step S409).

At step S411, the program verification is performed using the second verifying voltage PV2 to determine if the cells in the second group are in a second state associated with second verifying voltage PV2. The program verification checks to see if the threshold voltage of the cells are greater than the second verifying voltage PV2. If the program verification is not passed, the PC is checked to see if its value is less than a predefined value PC_max (step 413).

In step S415, if the value of the PC is less than the predefined value PC_max, the program voltage is increased by a voltage increment Δ Vpgm in accordance with the ISPP method. The steps S407 to S413 are repeated.

On the other hand, at step S413, if the value of the PC is equal to the predefined value PC_max, the flash memory device determines that a program fail has occurred in the cell.

Referring back to step S411, if the program verification using the second verifying voltage PV2 is passed, the controller initiates a second MSB program operation to be performed on a third group of cells. The controller determines whether or not the program voltage Vpgm that was used to successfully program the second group is less than the third start voltage Vs3. If the program voltage Vpgm is equal to or greater than the third start voltage Vs3, the program operation is performed i using the program voltage Vpgm.

However, if the program voltage Vpgm is less than the third start voltage Vs3, the program voltage Vpgm is set to be equal to the third start voltage Vs3 (step S419). This eliminates the need to incrementally ramp up the program voltage Vpgm to the third start voltage Vs3, thereby saving time and power consumption.

A program operation is performed to put the cell in a third state associated with the third verifying voltage PV3 (step S421). The value of the PC is increased by 1 (step S423). A program verification is made to determine if the third group of cells passed the verification by using the third verifying voltage PV3, i.e., the cell is in the third state (step S425).

If the third group of cells are determined to have passed the program verification, the program operation is finished. If the program verification is not passed, the flash memory device determines whether or not the value of the PC is equal to the predefined value PC_max (step S427).

The program voltage Vpgm is increased by the voltage increment Δ Vpgm if the value of the PC is determined to be less than the predefined value PC_max (step S431). Steps S421-S427 are repeated as necessary. On the other hand, if the value of the PC is equal to the predefined value PC_max, the flash memory device determines that a program fail has occurred in the cell.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that other modifications and embodiments can be devised by those skilled in the art that fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of programming data in a flash memory device including a plurality of multi-level cells including a first cell and a second cell, the method comprising: performing a first program operation on the first cell and the second cell using a first program voltage, the first cell being in a first state when the first program operation is performed on the first cell;
   determining whether or not the first cell is programmed to a second state after the first program operation has been performed;
   if the first cell is determined to be in the second state, comparing the present program voltage and a start voltage for a second program operation;
   defining a second program voltage for the second program operation based on a result of the comparison; and
   performing the second program operation on the second cell using the second program voltage that has been defined according to the result of the comparison.

2. The method of claim 1, wherein defining the second program voltage involves setting the start voltage as a initial voltage of increasing second program voltage if the present voltage is smaller than the start voltage for the second program operation.

3. The method of claim 2, wherein the first cell has been programmed to put the first cell in the first state prior to the first program operation.

4. The method of claim 1, further comprising:
performing a least significant bit (LSB) program on the first cell to program the first cell to the first state, wherein the LSB program is performed prior to the first program operation.

5. The method of claim 1, wherein the first and the second program voltage are increased according to an increment step pulse program (ISPP) method.

6. The method of claim 1, wherein a program fail is deemed to have occurred if the second cell is determined not be in the third state after performing a predefined number of program operations.

7. The method of claim 1, wherein the first, second, and third states are associated with first, second, and third verifying voltages, respectively.

8. A method of programming data in a flash memory device including multi level cells having certain levels comprising:
performing a program operation about cells having first level from a preset first start voltage;
discriminating using a first verifying voltage whether or not a program verification about the cells having the first level is passed, increasing a program voltage in steps by a given voltage in case that the program verification is not passed, and then performing again the program operation;
comparing a present program voltage with a second start voltage set about cells having a second level in case that the program verification is passed, and performing the program operation from the present program voltage or the second start voltage in accordance with the comparison result; and
discriminating using a second verifying voltage whether or not a program verification about the cells having the second level is passed, increasing in steps the program voltage by a given voltage in case that the program verification about the cells having the second level is not passed, and then performing again the program operation.

9. The method of claim 8, wherein the program voltage is increased by the given voltage in accordance with an increment step pulse program (ISPP) method.

10. The method of claim 8, further comprising:
comparing the present program voltage with the second start voltage in case that the program verification about the cells having the first level is passed; and
changing the program voltage into the second start voltage in case that the present program voltage is smaller than the second start voltage, increasing in steps the program voltage from the second start voltage, and then performing again the program operation.

11. The method of claim 10, further comprising:
increasing in steps the program voltage without changing the present program voltage in case that the present program voltage is the same as or higher than the second start voltage, and then performing the program operation.

12. The method of claim 8, further comprising:
counting the number of the program operation.

13. The method of claim 12, wherein it is determined that a fail is occurred in a corresponding cell in case that the number of the program operation is more than a predetermined maximum value.

14. The method of claim 8, wherein the first start voltage is set about a first verifying level related to the program verification about the cells having the first level.

15. The method of claim 8, wherein the second start voltage is set about a second verifying level related to the program verification about the cells having the second level.

16. The method of claim 8, wherein the cells having the first level correspond to a lower voltage level compared to the cells having the second level.

* * * * *